United States Patent [19]

Fan et al.

[11] Patent Number: 4,863,877

[45] Date of Patent: Sep. 5, 1989

[54] ION IMPLANTATION AND ANNEALING OF COMPOUND SEMICONDUCTOR LAYERS

[75] Inventors: John C. C. Fan, Chestnut Hill; Jhang W. Lee, Mansfield, both of Mass.; Jagdish Narayan, Raleigh, N.C.

[73] Assignee: Kopin Corporation, Taunton, Mass.

[21] Appl. No.: 120,035

[22] Filed: Nov. 13, 1987

[51] Int. Cl.$^4$ .................. H01L 21/263; H01L 21/225
[52] U.S. Cl. .............................. 437/22; 148/DIG. 65; 148/DIG. 84; 148/DIG. 72; 148/DIG. 149; 437/26; 437/82; 437/126; 437/108; 437/132; 437/80; 437/973; 156/603; 156/610
[58] Field of Search .................. 148/DIG. 3, 22, 72, 148/65, 143, 154, 150, 149, 71, 76, 84, 603, 628; 156/610; 437/22, 24–26, 82, 126, 132, 83, 108, 247, 934, 931, 80, 36, 949, 962, 973

[56] References Cited

U.S. PATENT DOCUMENTS

| | | | |
|---|---|---|---|
| 4,174,982 | 11/1979 | Immorlica, Jr. | 437/22 |
| 4,177,084 | 7/1979 | Lau et al. | 437/21 |
| 4,193,182 | 3/1980 | Lee | 437/26 |
| 4,312,681 | 1/1982 | Rupprecht et al. | 437/22 |
| 4,333,226 | 6/1982 | Abe et al. | 437/24 |
| 4,377,437 | 3/1983 | Taylor et al. | 156/646 |
| 4,391,651 | 7/1983 | Yoder | 437/26 |
| 4,396,437 | 8/1983 | Kwok et al. | 437/22 |
| 4,494,997 | 1/1985 | Lemnios et al. | 437/22 |
| 4,509,990 | 4/1985 | Vasudev | 437/26 |
| 4,544,417 | 10/1985 | Clarke et al. | 437/247 |
| 4,558,509 | 12/1985 | Tiwari | 437/22 |
| 4,569,124 | 2/1986 | Rensch et al. | 437/41 |
| 4,588,447 | 11/1986 | Golecki | 437/11 |
| 4,602,965 | 7/1986 | McNally | 357/91 |
| 4,659,392 | 3/1987 | Vasudev | 437/24 |
| 4,713,354 | 12/1987 | Egawa et al. | 437/22 |

FOREIGN PATENT DOCUMENTS

WO87/04563 7/1987 PCT Int'l Appl. .
WO87/04854 8/1987 PCT Int'l Appl. .

OTHER PUBLICATIONS

Howes et al., *Gallium Arsenide Materials, Devices, and Circuits*, John Wiley & Sons, New York, NY, 1985, pp. 163–166.
Sze, *VLSI Technology*, McGraw-Hill Book Co., New York, NY, 1983, pp. 220–224.
Turner et al., "High-Speed Photoconductive Detectors Fabricated in Heteroepitaxial GaAs Layers", Mat. Res. Soc. Symp. Proc., vol. 67, 1986, pp. 181–188.
Wolf et al., *Silicon Processing for the VLSI Era*, Lattice Press, Sunset Beach, California, 1986, pp. 305–308.
Lau et al., *Appl. Phys. Lett.*, 34(1):76–78 (Jan. 1, 1979).

*Primary Examiner*—Brian E. Hearn
*Assistant Examiner*—William Bunch
*Attorney, Agent, or Firm*—Hamilton, Brook, Smith & Reynolds

[57] ABSTRACT

A method for reducing the defect and dislocation density in III–V material layers deposited on dissimilar substrates is disclosed. The method involves ion implantation of dopant materials to create amorphous regions within the layers followed by an annealing step during which the amorphous regions are recrystallized to form substantially monocrystalline regions. The wafers produced by the process are particularly well suited for optoelectronic devices.

41 Claims, 2 Drawing Sheets

ION IMPLANTATION AND ANNEALING OF COMPOUND SEMICONDUCTOR LAYERS

BACKGROUND OF THE INVENTION

Much of modern semiconductor technology makes use of thin solid films on the surfaces of solid substrates. A number of methods have been used to deposit such thin films including thermal evaporation, DC sputtering, RF sputtering, ion beam deposition, chemical vapor deposition, plating, molecular beam deposition and deposition from the liquid phase.

The structure of thin films can be amorphous (that is, the film is composed of many small regions, in each of which the atoms are arranged in a regular crystalline order, but the small regions have no mutual alignment of their crystallographic axes), textured-polycrystalline (that is, the film is composed of many small regions, in each of which the atoms are arranged in a regular crystalline order, and one or more of the crystalline axes of the majority of said regions are parallel), or epitaxial (that is, the film is predominantly of a single crystallographic orientation). An epitaxial or nearly single crystal film is a special case of a preferred orientation film in which corresponding crystallographic axes of all the small regions are essentially oriented in the same directions. A thin film can be the same material (that is, the same element or compound) as the substrate (producing a "homogeneous" structure), or it can differ in chemical composition from the substrate (producing a heterogeneous structure). If the film is epitaxial, the former is called "homoepitaxy" and the latter "heteroepitaxy".

By "crystallization" is meant the process of arranging the atoms of a substance in a crystalline order. For convenience, the term should also be understood to encompass "recrystallization" as well, when referring to a substance which already has some degree of crystalline order, in which case, the atoms are arranged in a higher crystalline order by "recrystallization".

In the pursuit of low-cost, efficient solar cells, for example, there is currently strong interest in depositing various semiconductor films on low-cost substrates. However, when the total costs of photovoltaic systems are considered, the balance of system costs are normally so high that highly-efficient cells are preferred. In other applications, such as semiconductor lasers, light emitting diodes (LEDs) and integrated circuits, high quality semiconductor layers are also needed.

Because of the cost and efficiency consideration, one is frequently confronted with trying to deposit high-quality semiconductor layers on substrates significantly different from the layer, in crystal structure, lattice constants and thermal expansions—factors which are instrumental in determining whether good layers can be obtained. The most critical problem of growing such layers on dissimilar substrates is the lattice mismatch between the materials, which often causes a large density of dislocations in the resultant grown layers. To reduce the dislocation densities, various ideas have been proposed, ranging from graded interface alloys (for example, see J. C. C. Fan, C. O. Bozler and R. W. McClelland, Proc. of 15th IEEE Photovoltaic Specialists Conf., June 1981, Florida, p. 666 and U.S. Pat. No. 4,357,183 issued to Fan et al.), to superlattice techniques (for example, see K. W. Mitchell, Proc. of 15th IEEE Photovoltaic Specialists Conf., June 1981, Florida, p. 142) to repeated thermal cycling during crystal growth (for example, see U.S. Pat. No. 4,632,712 issued to Fan et al.).

In U.S. Pat. No. 4,246,050 a method is disclosed for growing crystalline layers from the liquid phase employing a stepwise cooling procedure such that dislocation defects are more uniformly distributed over the surface of the growing layer.

While the proposals for reducing dislocations have varying degrees of merit, there still exists a need for simple methods for reducing dislocation densities in grown layers.

SUMMARY OF THE INVENTION

The invention pertains to a method for lowering the density of defects and dislocations present in wafers having III-V material layers deposited upon dissimilar substrates. More specifically, the invention pertains to a method for reducing defects and dislocations in III-V materials deposited on dissimilar substrates by using ion implantation methods to implant dopant ions within the III-V material. The implanted ions form amorphous regions within the III-V material. The wafer is then annealed to produce solid phase crystalline regrowth. In solid phase regrowth, the amorphous region is converted to single crystalline form from the adjacent monocrystalline seed or seeds. The regrowth temperatures are generally significantly below the melting points of the compounds. At such low temperatures, thermal defects are usually not created, and if the seeds have no defects, then the regrown regions are also essentially defect-free. The only major defects in solid phase epitaxy (SPE) are usually twins. They can be annealed off at higher temperatures, such as with rapid thermal annealing. For example, in GaAs, the regrowth temperature can be about 600° C. The period of growth is often several hours. The resulting crystalline III-V material exhibits a much lower defect and dislocation density than the III-V material as initially deposited. (Up to three orders of magnitude of lower defect densities can be achieved.)

If the implanted ions are dopants of the semiconductor material, the resultant annealed wafers will be heavily doped. Such wafers produced using this method are particularly well suited for use with lasers, light emitting diodes and optoelectronic devices. If As and Ga ions are implanted, the resultant annealed wafers can retain their high electrical resistivities. In these cases, such wafers are well suited for electronic devices.

DETAILED DESCRIPTION OF THE INVENTION

The crystal quality of III-V materials deposited upon dissimilar substrates can be improved using an amorphization method followed by an annealing. As used herein, the term III-V material refers to a compound made up of elements selected from group IIIA of the periodic table (such as Ga, Al and In) and elements selected from group VA of the periodic table (such as As and P). Representative III-V materials are GaAs, AlGaAs, InGaAs, InP and any combination of (Al, Ga, In)(As, P).

Figure 1:
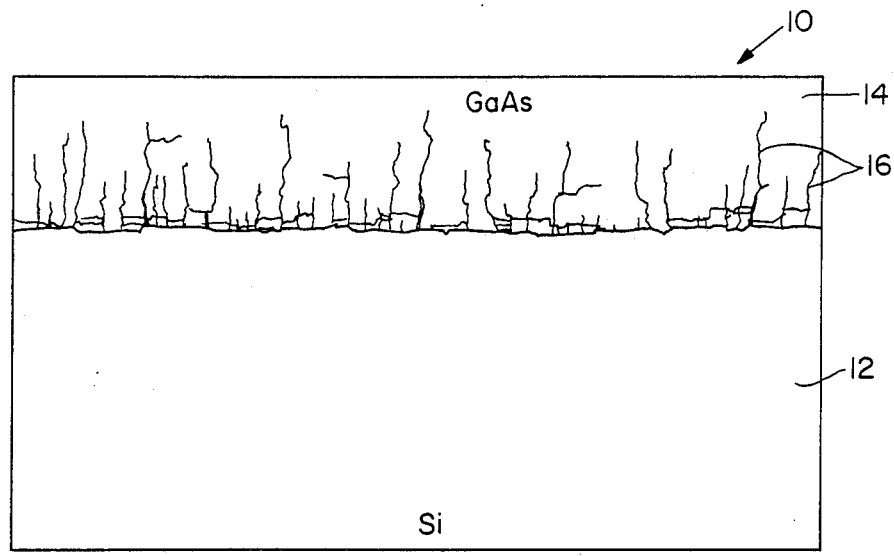
FIG. 1 is a schematic representation of a GaAs layer having a high defect and dislocation density deposited upon a silicon substrate.

When a few microns of III-V materials are deposited on dissimilar substrates, such as those of Si and Ge/Si, defects are observed to occur. The defects are generally in the form of threading defects and generally have a density of $10^6-10^7$ cm$^{-2}$. The lowest defect density is in the upper surface of the III-V material layer with defect density increasing toward the III-V/substrate interface. This is illustrated in FIG. 1 where the wafer 10 comprises a Si substrate 12 with a GaAs layer 14 deposited thereon. The GaAs layer 14 has many more defects 16 near the interface of the substrate 12 than it does in regions further from the substrate.

The threading defects and dislocations are believed to result from both imperfect lattice matching and thermal stresses resulting from the different coefficients of thermal expansion between the III-V material and the substrate.

The defect density can be decreased by several orders of magnitude by amorphization and annealing of the wafer. The amorphization is carried out by ion implantation using a beam source of selected ions. Of the ion implantation species, those ions which constitute wafer dopants are preferred, especially in devices requiring heavy doping such as optical devices. Using a dopant ion as the ion implantation species thus accomplishes the goal of doping and/or amorphization in a single step. Boron and zinc are the preferred p-type dopants; selenium and silicon are the preferred n-type dopants. While Ga and As are also implantation species choices, especially if both species are implanted at the same time, it has been believed that it would be difficult to obtain stoichiometric control, resulting in doping effects, either from excess Ga or excess As. However, in practice, the compound itself will retain its own stoichiometric ratio, with excess Ga or As rejected to the surface from which it is readily etched off. Hydrogen and oxygen are usually avoided because they are likely to cause major electrical degradation of the GaAs layer.

Once the ion implantation species have been selected, they can be implanted using an ion beam source. For a dopant material such as Si implanted in GaAs a dose of over $10^{15}$ cm$^{-2}$ at about 200 keV is recommended. Conditions such as these have been found to produce amorphization in GaAs layers down to about 0.7 microns. The penetration depth depends on the implanted species and implantation conditions.

In some instances, it is desirable to grow a thin layer of GaAs (for example, less than 0.7 micron) in Si, and then use a low-energy implanter (for example, less than 150 KeV) to amorphize the GaAs all the way to below the Si interface. After SPE, the GaAs-on-Si can be introduced to the growth chamber to grow additional layers.

Multiple ion-implantation steps can be used to increase the penetration of the amorphization within the III-V material layer. This is done by successively increasing implantation voltages followed by successive annealing until the desired improvement in crystal quality is achieved.

In a further embodiment of the invention, the ion implantation beam is oriented parallel to the channeling angle of the III-V material. This technique is advantageous for a number of reasons. By ion implanting parallel to the channeling angle, amorphization occurs below the III-V surface layer. This is important because it allows amorphization of regions having the greatest need for defect repair. Furthermore, the channeling implantation leaves a thin surface layer of the III-V material in monocrystalline form, thereby eliminating crystallinity changes which are not necessary. While values will vary depending upon the materials and conditions used, orienting the implantation beam parallel to the channeling angle generally results in amorphization occurring at about 50 to 1000 angstroms below the surface layer.

Figure 2:
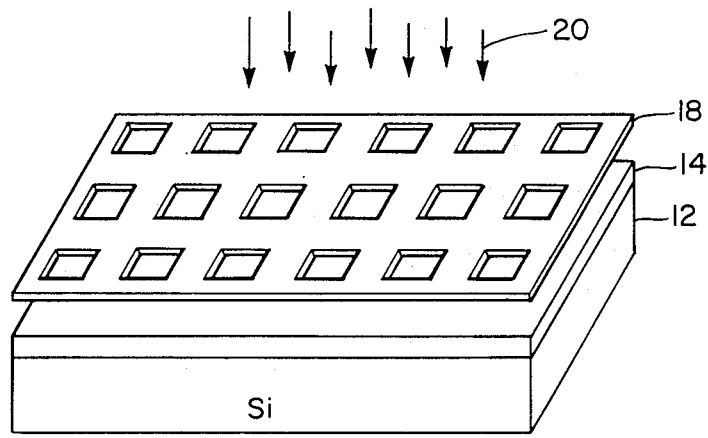
FIG. 2 is a schematic representation of an ion implantation method in which a screen is used to selectively prevent implantation and amorphization within the wafer.

In yet another embodiment of the invention, a screen or other shielding device is used to selectively prevent ion implantation on regions of the wafer. Thus the screen can be used to prevent amorphization of crystalline regions in some local areas, while simultaneously amorphizing the rest of the surface layer. The remaining crystalline regions become seeds for the solid phase epitaxial growth. This method is shown in FIG. 2. In FIG. 2, a wafer 10 comprises a substrate 12 and a GaAs layer 14. A screen 18 is positioned between the wafer 10 and the ion implantation beam 20. Regions of the GaAs layer 14 which underly openings in the screen 18 will undergo amorphization, while regions which are shaded by the screen will remain free of dopant implantation. Thus, the screen provides a simple, yet effective means of selectively doping and amorphizing the GaAs layer. Upon annealing the dopants will diffuse, resulting in quite uniformly doped regions. Nevertheless, for most optical applications, very uniformly-doped regions are often not required.

Another embodiment is to use an implantation condition that straddles between amorphization and crystallization. This results in a partially amorphous surface layer. A typical implantation process of this type for GaAs on Si is a dose of about $10^{15}$ cm$^{-2}$ at 200 KeV with Ga and As beams. In this case, uniformly-doped layers do result.

Another embodiment is to use a focused ion implantation beam which is scanned across the surface of the layer in a certain pattern resulting in a partially amorphous surface layer.

Once amorphous regions have been produced in the layer of III-V material, it is necessary to anneal the wafer. Annealing causes the amorphous III-V material to be converted to monocrystalline III-V material by regrowing the substantially crystalline III-V material near the surface region toward the amorphous III-V material. The annealing may be either a capless or a capped annealing method. If the annealing temperature is less than 500° C., capless annealing can be performed in an inert atmosphere, such as Ar or $N_2$. In this case, e.g., if 400° C. is used, the annealing time is preferably about one hour or more. A post-annealing process step is preferred to get rid of possible twins and other trapped defects. This is usually a rapid-thermal annealing process of less than 10 seconds at a temperature of between about 800° and 1000° C., preferably about 950° C. Under these conditions, no cap is needed.

Alternatively, to use higher annealing temperature for capless annealing, the wafer is exposed to an atmospheric overpressure of arsenic or phosphine-containing gas. The temperature is raised to between about 500° and 950° C. and the conditions are maintained until amorphous regions no longer remain. A preferred embodiment is capped annealing. In this method, an encapsulating layer is usually deposited on the wafer surface prior to ion implantation. This encapsulating layer allows annealing at high temperatures to be carried out in an inert rather than an arsenic-containing atmosphere since III-V compounds tend to decompose at elevated temperatures. For GaAs, the dissociation temperature is about 450° C. to 500° C. For InP, the dissociation temperature is about 300° to 350° C. Ideally, the encapsulation layer comprises about 1500 angstroms of $Si_3N_4$ onto which has been deposited about 1000 angstroms of $SiO_2$. As before, the temperature is raised to between about 550° and 950° C. and the annealing conditions are maintained until the amorphous regions have all recrystallized. In both capless and capped annealing, a furnace or rapid-thermal annealing apparatus can be used. In the case of rapid-thermal annealing, the annealing time is often less than 10 seconds, however, the annealing temperature can be raised to about 1000° C.

Also, in some instances, the ion-implantation can be carried out either with high fluences, or with the wafers being auxillarily heated in the implanter. In either case, the sample temperature can be elevated to 300°–400° C. in GaAs and the SPE annealing process is simultaneously performed during implantation.

Finally, it may be desirable to repeat the ion implantation and annealing steps concentrating on the surface of the III-V material layer. This step serves as a means of assuring that the III-V material is substantially monocrystalline throughout. In this embodiment, a second ion implantation process is performed to render the surface of the III-V material layer amorphous. This is followed by a second annealing step to recrystallize the amorphous III-V material to substantially monocrystalline III-V material. In the second ion implantation step, the voltage of the ion implantation apparatus is lowered to prevent deep penetration of the dopant ions. All other implantation and annealing parameters are as described previously.

The wafers produced by this method are well suited for optical devices as well as for monolithically integrated optical-electronic circuit applications. Of particular interest are optical devices such as light emitting diodes and lasers made from wafers produced by the process described herein. This results from the higher lifetime and improved performance of optical devices made using III-V material wafers having low defect and dislocation density.

Figure 3:
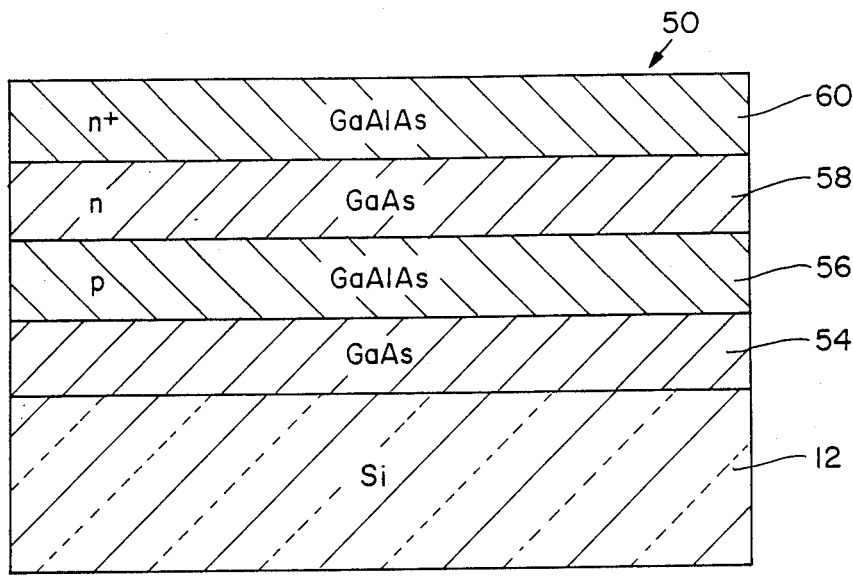
FIG. 3 is a schematic representation of a light emitting diode (LED) deposited upon a wafer having a low defect III-V material deposited upon a dissimilar substate.

A representation of a light emitting diode (LED) or multiple LEDs produced on a wafer processed under the method of this invention is given in FIG. 3. The LED 50, comprises a silicon substrate 12, upon which is deposited a low defect GaAs layer 54 which has reduced defect density as a result of ion implantation and annealing following deposition. The LED structure comprises a p-doped GaAlAs layer 56, an n-doped GaAs layer 58, and an n+-doped GaAlAs layer. Alternatively, the n-doped layer 58 may comprise GaAlAs.

The use of Si substrates will allow large-size wafers, thus permitting large numbers of of LEDs and lasers to be fabricated for one single wafer.

Figure 4:
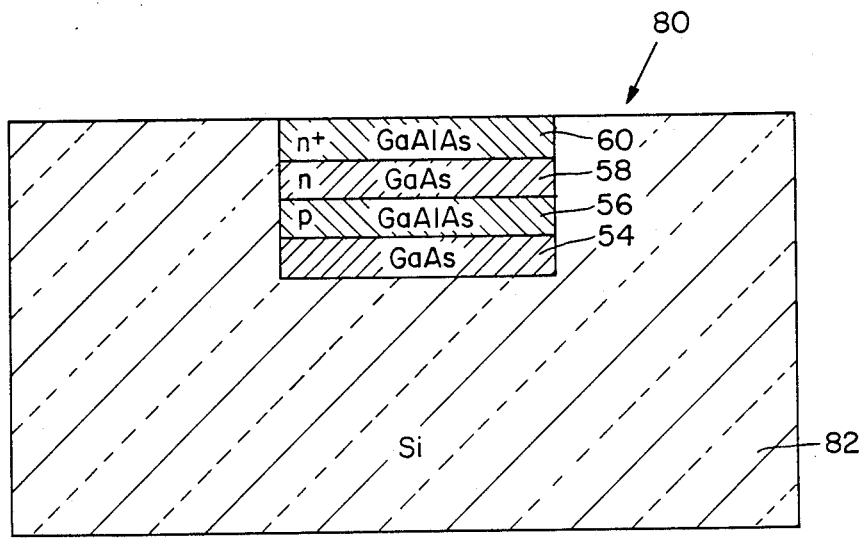
FIG. 4 is a schematic representation of a second embodiment of an LED deposited upon a wafer improved by the process of this invention.

FIG. 4 is a representation of another embodiment of an LED device 80 produced using a wafer processed by the method of this invention. In this example the silicon substrate 82, contains a recessed region 84. The silicon substrate 82 may also have a plurality of process devices upon its surface. The recess is filled with successive layers of low defect GaAs 54, p-doped GaAlAs 56, n-doped GaAs 58 and n+-doped GaAlAs 60. Devices of this type are particularly well suited as optical interconnects in optoelectronic devices. In both FIG. 3 and FIG. 4, layer 56 can instead comprise an n-doped GaAlAs, a p-doped GaAs or a p+-doped GaAlAs layer.

Equivalents

Those skilled in the art will recognize, or be able to ascertain, using no more than routine experimentation, many equivalents to the specific embodiments described herein. A similar ion implantation and annealing method as described herein can be used to lower the density of dislocations and defects in heteroepitaxial semiconductor layers of III-V materials deposited directly on dissimilar substrate materials. Such equivalents are intended to be encompassed in the following claims.

We claim:

1. A method for producing a wafer having a III-V material layer on a single crystal or substantially single crystal semiconductor substrate, the III-V material layer being of a material different than that of the substrate, said method comprising:
    a. epitaxially depositing the layer of III-V material on the single crystal or substantially single crystal semiconductor substrate;
    b. performing an ion implantation into the layer of III-V material to form an amorphous region in the layer of III-V material near the surface of the substrate, but leaving substantially monocrystalline III-V material above or adjacent the amorphous region as well as near the surface of the III-V material layer; and
    c. annealing the wafer at a temperature substantially below the melting temperature of the III-V material to convert amorphous III-V material to monocrystalline III-V material by regrowing the III-V material from the remaining substantially crystalline III-V material region.

2. A method as in claim 1 wherein the substrate is selected from the group consisting of monocrystalline Si and monocrystalline Ge/Si.

3. A method as in claim 1 wherein the III-V material comprises a combination of a material selected from the group consisting of Ga, Al and In, and a material selected from the group consisting of As and P.

4. A method as in claim 3 wherein the III-V material is selected from the group consisting of GaAs, AlGaAs, InGaAs and InP.

5. A method as in claim 1 wherein the ion implantation uses ion implantation species which are different than that of the III-V material.

6. A method as in claim 1 wherein the ion implantation uses ion implantation species selected from the class consisting of group IIIA and Group VA of the periodic table.

7. A method as in claim 5 wherein the ion implantation species is selected from the group consisting of n-type dopants and p-type dopants.

8. A method as in claim 7 wherein the ion implantation species is selected from the group consisting of B, Zn, Se and Si.

9. A method as in claim 1 wherein the ion implantation uses an ion beam having an energy selected to produce an implant having a maximum range lying near the interface between the III-V material layer and the substrate.

10. A method as in claim 9 wherein the ion beam is directed along the III-V material layer's crystal axis to thereby channel the ions through the monocrystalline III-V material layer to form an amorphous region in the III-V material layer near the substrate while leaving substantially monocrystalline III-V material in another region extending from the amorphitized region to the surface of the substrate layer.

11. A method as in claim 10 further comprising the steps of
 a. performing a second ion implantation to render amorphous the surface layer of III-V material which was left in a substantially monocrystalline state after the first ion implantation; and
 b. performing a second annealing step to convert the amorphous surface layer to monocrystalline III-V material.

12. A method as in claim 1 further comprising the steps of
 a. performing a second ion implantation to render amorphous the surface layer of III-V material which was left in a substantially monocrystalline state after the first ion implantation; and
 b. performing a second annealing step to convert the amorphous surface layer to monocrystalline III-V material.

13. A method as in claim 1 wherein the annealing step is a capless annealing.

14. A method as in claim 13 wherein the capless annealing is carried out at a temperature between about 550° and 950° C. using an arsenic or phospine overpressure.

15. A method as in claim 1 wherein the annealing step is a cap annealing.

16. A method as in claim 15 wherein the cap annealing uses an $Si_3N_4$ encapsulating layer.

17. A method as in claim 16 wherein the cap annealing uses a cap having a $Si_3N_4$ layer of about 1500 A covered with a $SiO_2$ layer of about 1000 A.

18. A method as in claim 11 wherein the second annealing step is a capless annealing.

19. A method as in claim 18 wherein the capless annealing is carried out at a temperature between about 550° and 950° C. using an arsenic or phosphine overpressure.

20. A method as in claim 12 wherein the second annealing step is a cap annealing.

21. A method as in claim 20 wherein the cap annealing uses an $Si_3N_4$ encapsulating layer.

22. A method as in claim 21 wherein the cap annealing uses a cap having a $Si_3N_4$ layer of about 1500 A covered with a $SiO_2$ layer of about 1000 A.

23. A method as in claim 1 wherein a screen is placed between a source of ion implantation and the wafer to selectively shield the wafer from ion implantation species, thereby producing amorphitization only in selected regions of the wafer.

24. A method as in claim 1 wherein ion implantation is carried out by scanning a focused ion beam across the surface of the wafer in a certain pattern, thereby producing amorphitization only in selected regions of the wafer.

25. A method as in claim 1 wherein the ion implantation step and the annealing step are carried out simultaneously.

26. A method as in claim 15 wherein ions are implanted through the annealing cap.

27. A method as in claim 20 wherein ions are implanted through the annealing cap.

28. A method as in claim 1 wherein a two step annealing process having a low temperatures annealing step followed by a high temperature annealing step is used.

29. A method as in claim 1 further comprising the step of growing a submicron III-V material layer upon the wafer subsequent to the annealing step.

30. A method for producing a wafer having a III-V material layer on a single crystal or substantially single crystal semiconductor substrate, the III-V material layer being of a material different than that of the substrate, said method comprising:
 a. epitaxially depositing the III-V material on a surface of the single crystal or substantially single crystal semiconductor substrate, thereby forming a layered article;
 b. performing an ion implantation into the layered article to form an amorphous region extending above and below the substrate surface; and
 c. annealing the wafer at a temperature substantially below the melting temperature of the III-V material and the substrate to convert material in the amorphous region to monocrystalline material by regrowth from a region of substantially crystalline material.

31. A method as in claim 30 wherein the substrate is selected from the group consisting of monocrystalline Si and monocrystalline Ge/Si.

32. A method as in claim 30 wherein the III-V material comprises a combination of a material selected from the group consisting of Ga, Al and In, and a material selected from the group consisting of As and P.

33. A method as in claim 32 wherein the III-V material is selected from the group consisting of GaAs, AlGaAs, InGaAs and InP.

34. A method as in claim 30 wherein the ion implantation uses ion implantation species which are different than that of the III-V material.

35. A method as in claim 30 wherein the ion implantation uses ion implantation species selected from the class consisting of group IIIA and Group VA of the periodic table.

36. A method as in claim 34 wherein the ion implantation species is selected from the group consisting of n-type dopants and p-type dopants.

37. A method as in claim 36 wherein the ion implantation species is selected from the group consisting of B, Zn, Se and Si.

38. A method as in claim 30 wherein the amorphous region extends from below the substrate surface to the interior of the III-V material while leaving substantially monocrystalline III-V material above or adjacent the amorphous region as well as near the surface of the III-V material layer.

39. A method as in claim 38 wherein the layered article is annealed at a temperature substantially below the melting temperature of the III-V material and the substrate to convert material in the amorphous region to monocrystalline material by regrowing the III-V material from the remaining substantially crystalline III-V material and substrate regions.

40. A method for producing a wafer having a III-V material layer on a single crystal or substantially single crystal semiconductor substrate, the III-V material layer being of a material different than that of the substrate, said method comprising:
  a. epitaxially depositing the layer of III-V material on the single crystal or substantially single crystal semiconductor substrate;
  b. performing an ion implantation into selected, isolated regions of the III-V material to form isolated amorphous regions of III-V material, but leaving substantially monocrystalline III-V material adjacent the III-V material layer; and
  c. annealing the wafer at a temperature substantially below the melting temperature of the III-V material to convert the isolated amorphous III-V material regions to monocrystalline III-V material by regrowing the III-V material from substantially crystalline III-V material adjacent to the amorphous regions.

41. A method for producing a wafer having a III-V material layer on a single crystal or substantially single crystal semiconductor substrate, the III-V material layer being of a material different than that of the substrate, said method comprising:
  a. epitaxially depositing the layer of III-V material on a surface of the single crystal or substantially single crystal semiconductor substrate, thereby forming a layered article;
  b. performing an ion implantation into the surface of the III-V material to form an amorphous surface region in the III-V material, but leaving substantially monocrystalline III-V material below the amorphous region; and,
  c. annealing the wafer at a temperature substantially below the melting temperature of the III-V material to convert amorphous III-V material to monocrystalline III-V material by regrowing the III-V material from the substantially crystalline III-V material region.

* * * * *